United States Patent [19]

Gailus et al.

[11] Patent Number: 4,857,928

[45] Date of Patent: Aug. 15, 1989

[54] METHOD AND ARRANGEMENT FOR A SIGMA DELTA CONVERTER FOR BANDPASS SIGNALS

[75] Inventors: Paul H. Gailus, Prospect Heights; William J. Turney, Schaumburg; Francis R. Yester, Jr., Arlington Heights, all of Ill.

[73] Assignee: Motorola, Inc., Schaumburg, Ill.

[21] Appl. No.: 149,350

[22] Filed: Jan. 28, 1988

[51] Int. Cl.$^4$ .............................................. H03M 3/00
[52] U.S. Cl. .................................... 341/143; 341/200; 375/26; 375/27
[58] Field of Search ............... 341/110, 115, 123, 124, 341/126, 131, 132, 134, 139, 200, 143; 364/485, 576, 605; 324/76 A, 77 R, 79 D, 83 D; 358/21 R, 23, 36, 37; 375/25–34

[56] References Cited

U.S. PATENT DOCUMENTS

| | | | |
|---|---|---|---|
| 2,927,962 | 3/1960 | Cutler | 375/26 |
| 3,192,371 | 6/1965 | Brahm | 364/605 |
| 3,560,957 | 2/1971 | Miura et al. | 341/122 |
| 3,876,946 | 4/1975 | La Clair et al. | 364/726 |
| 4,528,551 | 7/1985 | Agrawal et al. | 341/143 |
| 4,556,900 | 12/1985 | Willis | 358/23 |
| 4,600,901 | 7/1986 | Rabaey | 375/28 |

FOREIGN PATENT DOCUMENTS 0190694 3/1986 European Pat. Off. .

OTHER PUBLICATIONS

A Use of Double Integration in Sigma Delta Modulation, James C. Candy, IEEE Transactions on Communications, Mar. 1985, pp. 249–258.

Primary Examiner—William M. Shoop, Jr.
Assistant Examiner—Brian Young
Attorney, Agent, or Firm—Wayne J. Egan; Ronald G. Wesoloski

[57] ABSTRACT

An improved apparatus and method for a sigma delta converter for bandpass signals is disclosed, suitable for use in mobile radio applications, between the front end and digital signal processing stages, that includes at least one bandpass filter, an n-level quantizer, an n-level digital-to-analog (D/A) converter, and a direct current (DC) feedback network. The sigma delta converter for bandpass signals may be configured in a second order or a fourth order embodiment and achieves analog-to-digital conversion of a signal having a non-zero frequency carrier or suppressed carrier with improved signal-to-noise ratio performance and with minimal quantization error. As a result, the sigma delta conversion occures earlier in a receiver chain and a dynamic range of about 95–98 dB is achieved.

33 Claims, 3 Drawing Sheets

METHOD AND ARRANGEMENT FOR A SIGMA DELTA CONVERTER FOR BANDPASS SIGNALS

RELATED APPLICATIONS

This case is related to two co-pending applications. The first has Ser. No. 06/890,804, entitled All Digital Raido Frequency Receiver, filed on July 24, 1986, and the second has Ser. No. 07/062,816, entitled Low Power Digital Receiver, filed on June 15, 1987. Both of these co-pending patent applications are assigned to the assignee of the present invention. The apparatus and methods disclosed in each co-pending application are incorporated herein by reference.

BACKGROUND OF THE INVENTION

The present invention relates generally to analog-to-digital (A/D) converters, and more particularly to sigma delta A/D converters.

It is generally known that an analog signal can be converted to a digital signal (or vice versa) when the sampling frequency, $f_s$, of general A/D (or D/A) converters is selected to be about twice the signal frequency bandwidth, $f_{BW}$. This relationship between the sampling frequency, $f_s$, and the signal frequency bandwith, $f_{BW}$, is the familiar Nyquist's theorem.

In conventional oversampling A/D converters, the sampling frequency, $f_s$, is set higher than twice the signal frequency bandwidth, $f_{BW}$, which would be established by Nyquist's theorem, in order to achieve improved conversion precision by reducing conversion errors. Thus, when a sampled analog input signal is quantized into a digital signal in a conventional A/D conversion stage, a conversion error (or quantization error) occurs which is the difference between the analog input voltage and a digital output (quantized) step voltage. Such quantization error is given as a random value falling between an amplitude range of $+V_q/2$ and $-V_q/2$ with respect to a minimum quantized step voltage, $V_q$.

As a result, the frequency spectrum of the quantization noise produced by such quantization errors is spread in a uniform manner over the interval from 0 Hz to half the sampling rate, or $f_s/2$. Filtering is then used to eliminate the noise power outside of the desired signal bandwidth.

The well known sigma delta converter uses feedback to shape the quantization noise into a highpass characteristic. As a result, the quantization error is suppressed most at low frequencies, where the loop gain is highest. However, because the total root-mean-square (RMS) quantization error is constant and ultimately limited by the D/A conversion step size, the reduction in the low frequency quantization noise which effects the reduced quantization error is therefore accompanied by an increase in quantization noise at high frequencies. Hence, digital filters are generally used following the sigma delta converter to attenuate this undesired quantization noise at high frequencies, namely those above the cutoff frequency of one or more integrator stages within the sigma delta converter.

Furthermore, it is generally known that if additonal conversion precision is required beyond that available from a single integration, first-order sigma delta converter, a second integration stage can be incorporated to effect a second-order sigma delta converter. Such sigma delta A/D converters are well known for their ability to reduce inband noise power within a lowpass characteristic, and hence such converters operate best upon analog input signals operating at baseband. A baseband signal is defined here as one having a lowpass characteristic. Examples of ways to arrive at a baseband signal include down-converting or demodulating an RF signal with various known detection methods.

One application of particular interest for sigma delta A/D converters is in mobile radios utilized in modern communication systems. In such applications, a baseband signal can be provided when a received signal is down-converted to an intermediate frequency (IF) signal having a center frequency equal to zero Hertz (0 Hz), or when a signal, such as an IF signal, is detected to produce a baseband signal (i.e., falling between 0 Hz and an upper cutoff frequency, $f_c$, having a bandwith $f_{BW}$), with the carrier signal removed. Carrier signal is defined broadly herein as referring to the center frequency of RF signals or IF signals.

However, several disadvantages become apparent when attempting to convert a baseband analog signal to a digital signal utilizing a conventional sigma delta A/D converter having a lowpass characteristic. Namely, there is an inherent ambiguity in distinguishing between signals occuring at 0 Hz and DC offset voltages existing in active stages within the sigma delta A/D converter. Also, the unavoidable crosstalk between the in-phase and quadrature (or I/Q) channels of a zero-IF receiver can mix undesired out of band signals into the desired passband. A further disadvantage is that the noise present in active circuits is always higher at low frequencies due to flicker or 1/f noise. As a result, there are serious limitations placed upon the ultimate signal-to-noise ratio, and hence the dynamic range, that can be obtained in a given mobile radio application. Such limitations have been only partially overcome by various known arrangements which, at the expense of greater complexity, attempt to deal with the ambiguity created by the DC offset component, I/Q crosstalk, and added noise.

Accordingly, there exists a need for an improved, yet simpler, sigma delta A/D converter that provides greater dynamic range while avoiding the ambiguities, undesired signals, and added noise caused by attempting to convert signals occuring at 0 Hz. This permits the signal processing functions occuring thereafter to be performed digitally, including the required mixing, filtering, and demodulating functions. Such need exists for many applications requiring relatively fast, analog-to-digital conversion with low quantization error, including radio receiver applications.

SUMMARY OF THE INVENTION

It is an object of the present invention to provide a sigma delta converter which overcomes the foregoing deficiencies by converting an analog signal to a digital signal with improved signal-to-noise ratio performance and with minimal quantization error, while avoiding the ambiguity of signals falling at zero Hertz (0 Hz).

It is a further object of the present invention to provide a sigma delta converter of the foregoing type which operates upon bandpass signals by converting an input signal having a non-zero frequency carrier or suppressed carrier with modulation thereon from an analog signal to a digital signal.

In practicing the invention, one embodiment contemplates a second order sigma delta converter for bandpass signals, suitable for use in mobile radio applications, that includes at least one bandpass filter, an N- level quantizer, an N-level digital-to-analog (D/A) converter, and a direct current (DC) feedback network. In another embodiment, a fourth order sigma delta converter for bandpass signals is disclosed which further includes a second signal pole bandpass filter having an amplifier. Each of these embodiments achieves analog-to-digital conversion of a bandpass signal having a non-zero frequency carrier or supressed carrier with improved signal-to-noise ratio performance and with minimal quantization error. As a result, the sigma delta conversion occurs earlier in a radio receiver chain and a dynamic range of about 95-98 dB is achieved.

BRIEF DESCRIPTION OF THE DRAWINGS

Referring to the drawings, wherein like reference numerals indicate like elements in these several figures, and in which.

DETAILED DESCRIPTION OF THE PREFERRED EMBODIMENT

Figure 1:
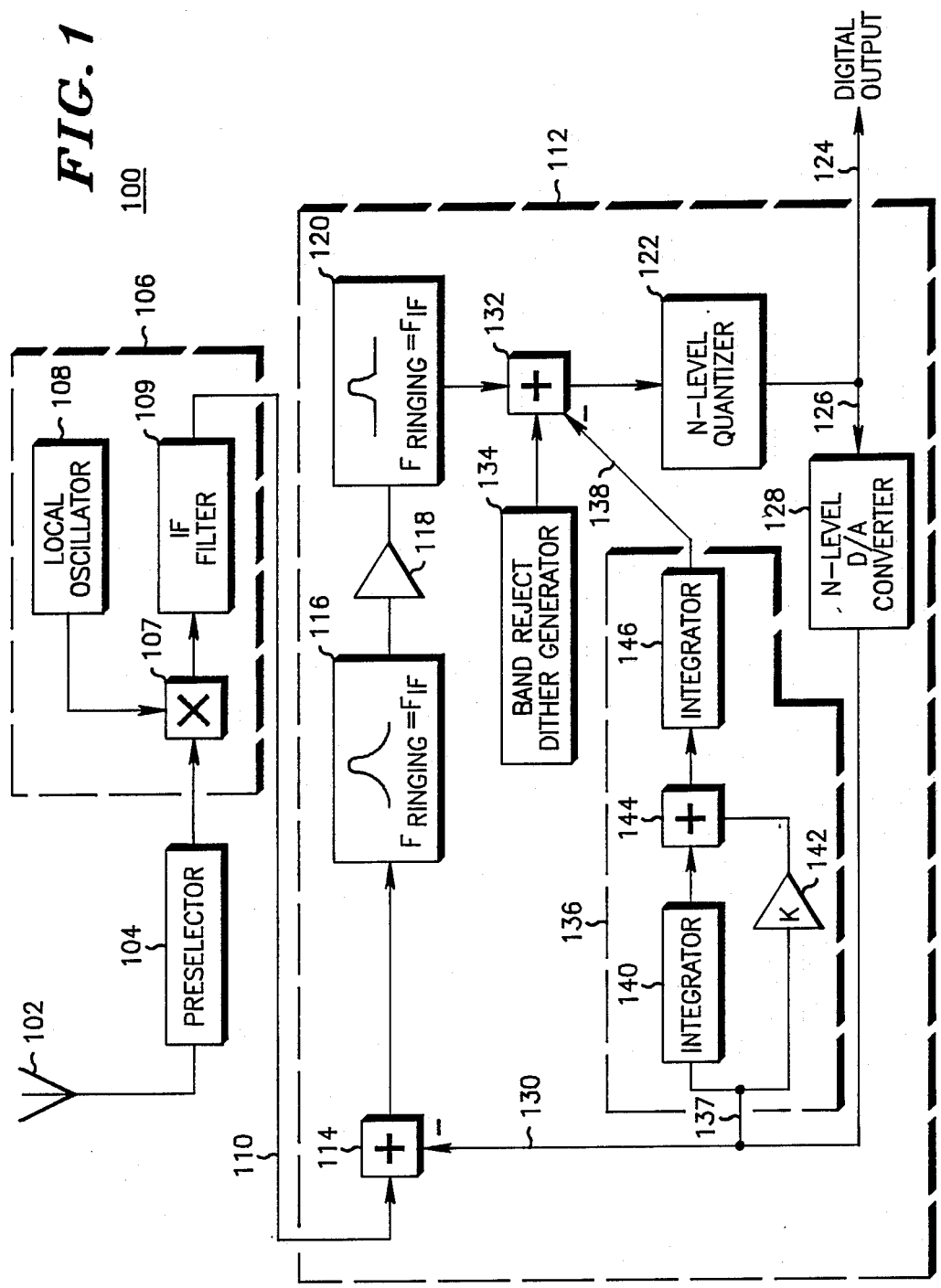
FIG. 1 is a simplified blocked diagram of a radio receiver having a front end and having one embodiment of the sigma delta converter for bandpass signals according to the present invention.

Referring now to the figures, FIG. 1 shows a radio receiver front end and a sigma delta converter constructed and arranged to receive an analog input signal and convert it to a digital output signal. As shown, the radio receiver includes an antenna 102, a preselector stage 104, which couples to a receiver front end 106 having a mixer 107, a local oscillator 108, and an intermediate frequency (IF) filter 109, as well as an output line 110.

Next, FIG. 1 at 112 depicts a simplified block diagram of the sigma delta converter for bandpass signals in accordance with the present invention. Sigma delta converter 112 includes a first summing node 114, coupled to a single pole bandpass filter 116, which is second-order and which has a ringing frequency set equal to the IF frequency presented from the output of front end 106 via output line 110. Although the ringing frequency, which is slightly different than the resonant frequency, is utilized because of the sampling nature of the sigma-delta conversion process, these terms will be used interchangeably for the center frequency.

The output of bandpass filter 116 couples to an IF amplifier 118, having IF gain of approximately 40 dB. Next, the output of IF amplifier 118 couples to another single pole bandpass filter 120, which is second-order and which has a ringing frequency set equal to the IF frequency. Filter 120 also includes dual-zero phase compensation to be discussed later. The output of bandpass filter 120 couples to a second summing node 132 which, in turn, couples to the input of an N-level quantizer stage 122 to provide the digital output signal at node 124, as shown, to an appropriate digital processing circuit (not shown). The output from N-level quantizer 122 also couples, via line 126, to the input of N-level digital-to-analog (D/A) converter stage 128, as shown. The output of D/A converter stage 128 couples, via line 130, to the minus input of the first summing node 114, as shown.

An optional band reject dither generator 134 may be included within the sigma delta converter of the present invention and coupled to the second summing node 132, as shown. The use of dither to randomize quantization errors and therefore smooth the frequency spectrum of the error is well known to those skilled in the art.

A direct current (DC) feedback network 136 is also provided within the sigma delta converter that helps minimize DC offset voltages. Feedback network 136 has an input port 137, which is fed by the output of D/A converter 128, as well as an output port 138, which couples to a minus input of second summing node 132. The DC feedback network input port 137 couples to a first integrator stage 140, as well as to an amplification stage 142, as shown. The outputs of each of integrator 140 and constant gain amplifier 142 couple to an included summing node 144, which drives the input of a second integrator 146, as shown.

The sigma delta converter shown in block diagram form in FIG. 1 at 112 is referred to as fourth order because it includes two bandpass filters, 116 and 120, each being second-order. A second order sigma delta converter is arranged by deleting the second bandpass filter 120 and coupling the output of IF amplifier 118 directing to the summing node 132. Also, although shown generally in block diagram form as comprised of single ended components, namely those with a single active line with respect to a common ground, the preferred embodiment is constructed utilizing elements having dual differential leads with respect to a common or chassis ground so that better noise immunity is provided, and is given in the next figure. The two-fold symmetry provided by this dual differential embodiment provides additional and substantial advantages when quantizer 122 and D/A converter 128 have two levels (1 bit). In this case, the signal-to-noise ratio will not degrade as long as each of these two levels produce equal but opposite responses throughout the converter. Unequal rise and fall times of signals in a single-ended embodiment will degrade performance because it will weight one level higher than the other. One can minimize this degradation by making the rise and fall times extremely fast, but at the expense of substantially increased power requirements. In a fully differential implementation, rise and fall times can differ and performance will not be degraded as long as each side of the differential circuits behave identically. Hence, power requirements are substantially reduced.

Figure 2:
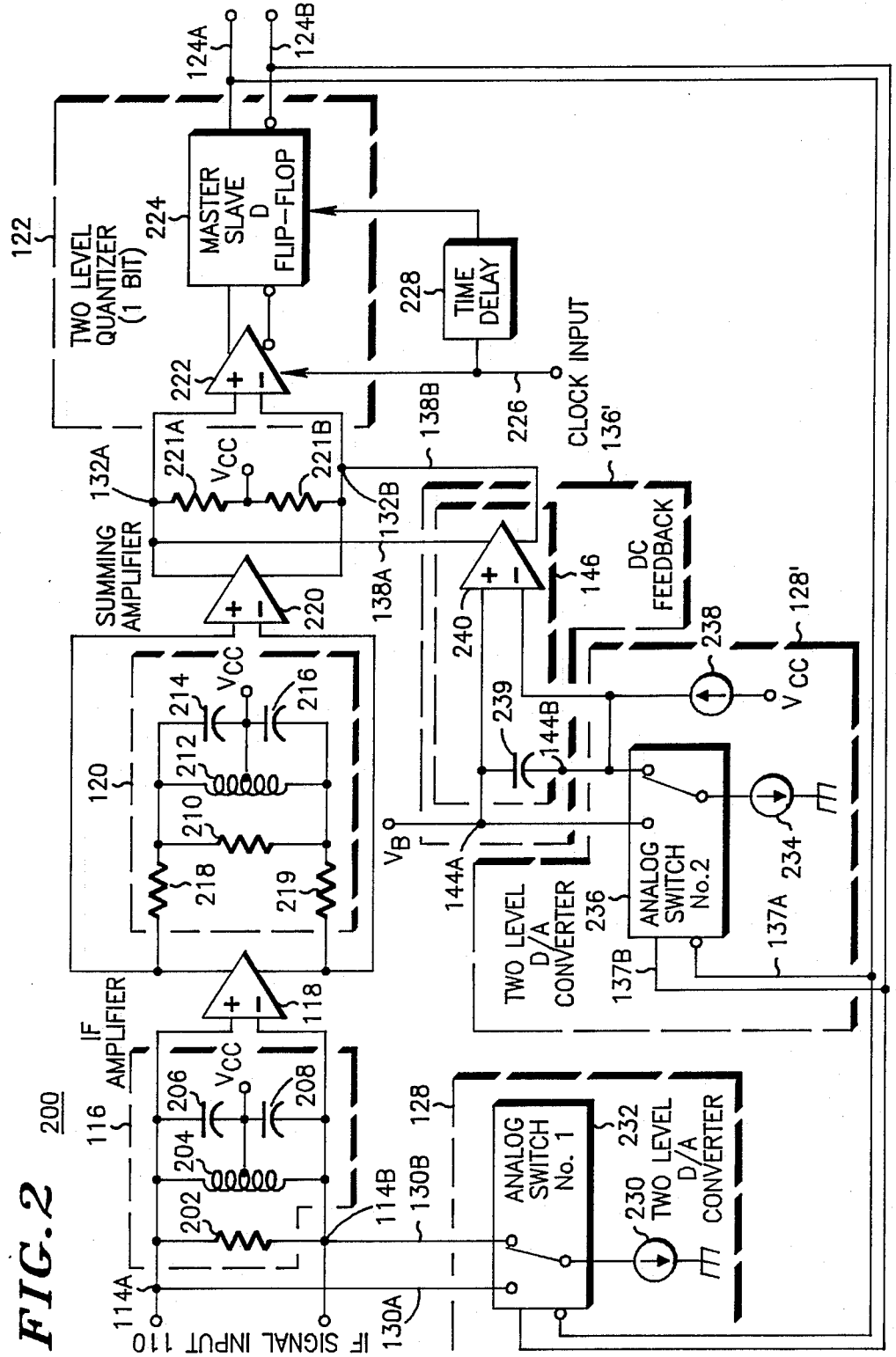
FIG. 2 is a detailed schematic diagram of the sigma delta converter depicted in FIG. 1.

Referring next to FIG. 2, a more detailed schematic diagram of the fourth order sigma delta converter 112 introduced in FIG. 1 is depicted at 200 having IF signal input 110 and a two-level digital output 124 having differential leads 124A and 124B. First summing node 114 is represented by points 114A and 114B, as shown. Following summing node 114 is bandpass filter 116, depicted in dashed outline form. It includes a resistor 202 to set the bandwidth as well as an inductor 204 and capacitors 206 and 208 which cooperate to provide a damped sinusoidal impulse response with a ringing frequency set equal to the IF frequency.

Next, IF amplifier 118 follows bandpass filter 116 and includes dual differential inputs and outputs. Amplifier 118 produces a current at its outputs proportional to the voltage difference between its inputs. Then, a second bandpass filter 120 follows amplifier 118 and includes resistor 210 in a parallel combination with inductor 212 and the series connection of capacitors 214 and 216 which cooperate to provide a ringing frequency set equal to the IF frequency similar to filter 116. Those skilled in the art will recognize that the LC resonators shown in bandpass filters 116 and 120 can also be implemented in known ceramic or other piezoelectric technologies. Alternatively, the inductors 204 and 212 can be replaced by active circuits, such as gyrators.

Filter 120 also includes dual zero phase compensation via resistors 218 and 219 to provide sufficient phase margin for this fourth order sigma delta converter for frequencies below or above resonance. This dual zero phase compensation provides a network that ensures stable operation by having the total loop phase lead or phase lag less than 180 degrees at frequencies below that of a "zero signal idle pattern". The zero signal idle pattern for the fourth order bandpass sigma delta converter during no signal and no dither operation consists of a pattern as follows: . . . 11001100 . . . for this fourth order system. Following filter 120 is summing node 132 which comprises summing amplifier 220 and resistors 221A and 221B which couple to points 132A and 132B. Summing amplifier 220 produces a differential current at its outputs proportional to the voltage difference between its inputs.

N-level quantizer 122 is depicted as a two level A/D converter 122 which includes a latching comparator 222 driving a master slave (M-S) D type flip-flop that is driven by a clock signal, via input line 226, from a clock oscillator (not shown). This clock signal, which may be supplied from a source such as a microcontroller clock oscillator, determines the sampling rate for the overall sigma delta converter. In this fourth order embodiment, a sampling frequency of about 14.4 MHz was chosen, which is 32 times the IF frequency, namely 450 KHz. Time delay 228 is included to ensure that the output of the latching comparator 222 reaches its full value before it is transferred to flip-flop 224. Too short of a delay introduces errors due to insufficient level, whereas too long of a delay creates extra phase shift that causes the loop to go unstable. The output of this two level A/D converter 122 provides the 1 bit (2-level) digital output in differential form via lines 124A and 124B, and is fed back to a 2-level D/A converter 128, which has a constant current sink (or source) 230, having a constant value of current=$I_1$, driving analog switch 232 controlled by the 1-bit digital output signal. The resulting output follows lines 130A and 130B back to the first summing node 114, represented by points 114A and 114B, to complete the feedback loop.

Also included within sigma delta converter 200 is DC feedback network 136' and another 2-level D/A converter 128' that has its own constant current sink (or source) 234, having current=$2I_2$, analog switch 236, and constant current source 238, having a constant value of current=$I_2$. DC feedback network 136' further includes capacitor 239 across summing nodes 144A and 144B, representing summing node 144, for developing a voltage that is fed to the voltage controlled inputs of amplifier 146 having current mode output lines 138A and 138B that drive the second summing node 132, represented by points 132A and 132B. Thus, it is clear that DC feedback network 136' represents a simplified version of the DC feedback network 136 depicted earlier in FIG. 1, in that the first integrator stage 140 and amplifier 142 have been omitted.

Figure 3:
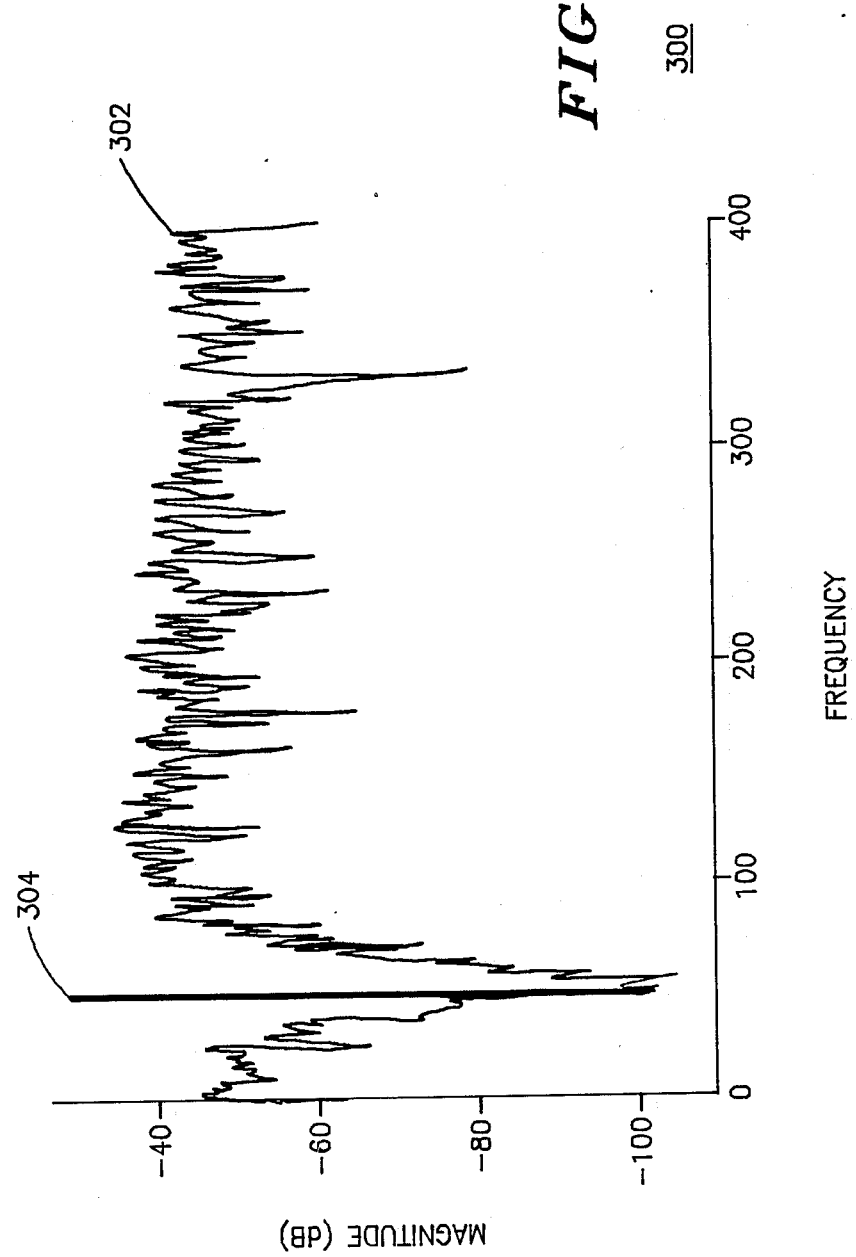
FIG. 3 is a frequency spectral diagram representative of the Nyquist bandwidth in the vicinity of a non-zero frequency carrier for the sigma delta converter depicted in FIG. 2.

Turning next to FIG. 3, a frequency spectral diagram is shown that simulates the performance of the arrangement previously given in FIG. 2. This frequency spectral diagram shows the characteristic suppression of noise 302 within the passband response of the bandpass filters and especially near the vicinity of the center, or carrier, frequency 304. The simulated conditions were for a fourth order sigma delta converter for bandpass signals utilizing a first and a second two pole bandpass filter and having a sampling frequency equal to 16 times the ringing frequency (or center frequency) of the filters. Each of the two bandpass filters had a quality factor, (or Q) equal to 40, and the ultimate stopband response of filter 120 was set to 0.01 or −40 dB by the dual zero phase compensation. [0 dB, which is off the vertical scale of FIG. 3, corresponds to the maximum signal level at the 1 bit output 124.] As can be seen, for out of band signals, the average noise level 302 is approximately −40 dB on the vertical magnitude axis, whereas for signals very nearly equal to the center frequency 304 of the sigma delta converter's passband, an improved signal-to-noise ratio performance has allowed a dynamic range of approximately 95 to 98 dB to be achieved. Although this simulation was run for a center frequency of 50 Hz, the circuitry given in FIG. 2 operates well at higher IF frequencies, including an IF frequency of approximately 450 KHz.

As inferred by the spectral diagram of FIG. 3, the sigma delta converter for bandpass signals according to the present invention offers improved performance at the IF passband frequencies over other known converters that operate satisfactorily only for baseband signals. That is, the present method and arrangement provides performance 82 dB better in the desired IF passband than what would be achieved if a conventional sigma delta converter were utilized that operated at the same sampling frequencies which are much higher than those required for baseband signals. Although a conventional converter will show less degradation if the IF passband frequency is lowered, image and other known spurious responses prevent any substantial improvement to be achieved by the use of this method.

The clock input signal provided to line 226 for the sigma delta converter according to the present invention requires a minimum sampling rate of at least four times the IF frequency for the disclosed fourth order system in order that the frequencies of the idle pattern be removable from the passband. In the example given above, practical sampling rates should be at least double these minimum rates in order to ease filtering requirements and improve stability of the sigma delta converter arrangement. Moreover, for a simpler second order system in which only a single pole bandpass filter is utilized, the minimum sampling rate must be greater than or equal to two times the RF frequency in order that the idle pattern (namely . . . 101010 . . . ) for such a second order system be removable from the passband. Furthermore, it will be apparent to those skilled in the art that IF amplifier 118 is necessary only because an ideal quantizer, or N-level A/D converter 122 is not presently available. The practical two level quantizer 122 depicted in FIG. 2 has limited gain in its linear region at a given sampling rate, and therefore the noise figure of this device is relatively poor. Thus IF amplifier 118 is required in the location shown in order to provide low noise takeover gain to improve the overall noise figure, and to reduce the quantization errors caused by finite gain within the two level quantizer 122.

As a result, each of the above arrangements is able to overcome the limitations of the known art. That is, these embodiments provide a sigma delta converter for bandpass signals that signficantly reduces noise most at the desired IF frequency. These embodiments, therefore, provide minimal signal-to-signal ratio degradation and quantization error, while simplifying the sigma delta analog-to-digital conversion of bandpass signals without the DC offset problems common in conventional zero-IF arrangements.

Although the arrangements of the present invention fully disclose many of the intended advantages, it is to be understood that various changes and modifications may be made by those skilled in the art, without departing from the scope of the above invention.

We claim:

1. An apparatus for converting a signal having a non-zero frequency carrier or suppressed carrier with modulation thereon from an analog signal to a digital signal with improved signal-to-noise ratio performance, the apparatus comprising:
   (a) bandpass filtering means, having an input coupled to a first summing node, an output coupled to a positive input of a second summing node, and having an associated damped sinusoidal impulse response therein, for filtering the analog signal before applying it to the second summing node;
   (b) n-level quantizing means, having an input coupled to said second summing node, for quantizing the analog signal into a digital signal by oversampling and providing a digital signal having a plurality of levels (n) at an output therefrom;
   (c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio perforrmance; and
   (d) direct current (DC) feedback means, having an input coupled to the output of said D/A converting means and an output coupled to a negative input of said second summing node, for feeding back a DC voltage to minimize DC offset voltages within the apparatus.

2. An apparatus for converting a signal having a non-zero frequency carrier or suppressed carrier with modulatin thereon from an analog signal to a digital signal with improved signal-to-noise ratio performance, the apparatus comprising:
   (a) bandpass filtering means, having an input coupled to a first summing node, an output coupled to a positive input of a second summing node, and having an associated damped sinusoidal impulse response therein, for filtering the analog signal before applying it to the second summing node, wherein said bandpass filtering means further comprises amplifying means for amplifying the signal passing therethrough;
   (b) n-level quantizing means, having an input coupled to said second summing node, for quantizing the analog signal into a digital signal by oversampling and providing a digital signal having a plurality of levels (n) at an output therefrom;
   (c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and
   (d) direct current (DC) feedback means, having an input coupled to the output of said D/A converting means and an output coupled to a negative input of said second summing node, for feeding back a DC voltage to minimize DC offset voltages within the apparatus.

3. The apparatus according to claim 2, wherein said amplifying means includes an operational amplifier having gain of approximately 40 dB.

4. An apparatus for converting a signal having a non-zero frequency carrier or suppressed carrier with modulation thereon from an analog signal to a digital signal with improved signal-to-noise ratio performance, the apparatus commprising:
   (a) bandpass filtering means, having an input coupled to a first summing node, an output to a positive input of a second summing node, and having an associated damped sinusoidal impulse response therein, for filtering the analog signal before applying it to the second summing node, wherein said bandpass filtering means includes at least a single pole bandpass filter having a ringing frequency essentially equal to the non-zero carrier frequency;
   (b) n-level quantizing means, having an input coupled to said second summing node, for quantizing the analog signal into a digital signal by oversampling and providing a digital signal having a plurality of levels (n) at an output therefrom;
   (c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and
   (d) direct current (DC) feedback means, having an input coupled to the output of said D/A converting means and an output coupled to a negative input of said second summing node, for feeding back a DC voltage to minimize DC offset voltages within the apparatus.

5. The apparatus according to claim 4, wherein said single pole bandpass filter includes at least a parallel resonant resistor, inductor, capacitor (R-L-C) network.

6. An apparatus for converting a signal having a non-zero frequency carrier or suppressed carrier with modulation thereon from an analog signal to a digital signal with improved signal-to-noise ratio performance, the apparatus comprising:
   (a) bandpass filtering means, having an input coupled to a first summing node, an output couple to a positive input of a second summing node, and having an associated damped sinusoidal impulse response therein, for filtering the analog signal before applying it to the second summing node, wherein said bandpass filtering means includes a first and a second pole bandpass filter, with the second bandpass filter having a dual-zero phase compensation network therein in order to ensure loop stability;
   (b) n-level quantizing means, having an input coupled to said second summing node, for quantizing the analog signal into a digital signal by oversampling and providing a digital signal having a plurality of levels (n) at an output therefrom;
   (c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and (d) direct current (DC) feedback means, having an input coupled to the output of said D/A converting means and an output coupled to a negative input of said second summing node, for feeding back a DC voltage to minimize DC offset voltages within the apparatus.

7. The apparatus according to claim 6, wherein said first and second bandpass filters include parallel resonant R-L-C networks, with the second bandpass filter including 2 additional resistors for providing the dual-zero phase compensation therein.

8. The apparatus according to claim 4, wherein said bandpass filter includes a ceramic bandpass filter.

9. The apparatus according to claim 4, wherein said bandpass filter includes a piezoelectric bandpass filter.

10. An apparatus for converting a signal having a non-zero frequency carrier or suppressed carrier with modulation thereon from an analog signal to a digital signal with improved signal-to-noise ratio performance, the apparatus comprising:

(a) bandpass filtering means, having an input coupled to a first summing node, an output coupled to a positive input of a second summing node, and having an associated damped sinusoidal impulse response therein, for filtering the analog signal before applying it to the second summing node;

(b) n-level quantizing means, having an input coupled to said second summing node, for quantizing the analog signal into a digital signal by oversampling and providing a digital signal having a plurality of levels (n) at at output therefrom;

(c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and (d) direct current (DC) feedback means, having an input coupled to the output of said D/A converting means and an output coupled to a negative input of said second summing node, for feeding back a DC voltage to minimize DC offset voltages within the apparatus, wherein said DC feedback means includes at least an integrator and a summing junction to further reduce qunatization error by minimizing any effects of DC offset voltages within the apparatus.

11. An apparatus for converting a signal having a non-zero frequency carrier or suppressed carrier with modulation thereon from an analog signal to a digital signal with improved signal-to-noise ratio performance, the apparatus comprising:

(a) bandpass filtering means, having an input coupled to a first summing node, an output coupled to a positive input of a second summing node, and having an associated damped sinusoidal impulse response therein, for filtering the analog signal before applying it to the second summing node;

(b) n-level quantizing means, having an input coupled to said second summing node, for quantizing the analog signal into a digital signal by oversampling and providing a digital signal having a plurality of levels (n) at an output therefrom, wherein said n-level quantizing means includes an A/D converter having n=2;

(c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and (d) direct current (DC) feedback means, having an input coupled to the output of said D/A converting means and an output coupled to a negative input of said second summing node, for feeding back a DC voltage to minimize DC offset voltages within the apparatus.

12. The apparatus according to claim 11, wherein said A/D converter having n=2 comprises a latching comparator coupled to a master-slave (M-S) flip-flop, with said comparator driven by a clock signal and said M-S flip-flop driven by a delayed clock signal through an included delay stage.

13. An apparatus for converting a signal having a non-zero frequency carrier or suppressed carrier with modulation thereon from an analog signal to a digital signal with improved signal-to-noise ratio performance, the apparatus comprising:

(a) bandpass filtering means, having an input coupled to a first summing node, an output coupled to a positive input of a second summing node, and having an associated damped sinusoidal impulse response therein, for filtering the analog signal before applying it to the second summing node;

(b) n-level quantizing means, having an input coupled to said second summing node, for quantizing the analog signal into a digital signal by oversampling and providing a digital signal having a plurality of levels (n) at an output therefrom;

(c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance, wherein said n-level D/A converting means comprises a D/A converter having n=2; and (d) direct current (DC) feedback means, having an input coupled to the output of said D/A converting means and an output coupled to a negative input of said second summing node, for feeding back a DC voltage to minimize DC offset voltages within the apparatus.

14. The apparatus according to claim 13, wherein said D/A converter having n=2 comprises an analog switch and a controled current stage, which sinks or sources a constant value of current.

15. An apparatus for converting a signal having a non-zero frequency carrier or suppressed carrier with modulation thereon from an analog signal to a digital signal with improved signal-to-noise ratio performance, the apparatus comprising:

(a) bandpass filtering means, having an input coupled to a first summing node, an output coupled to a positive input of a second summing node, and having an associated damped sinusoidal impulse response therein, for filtering the analog signal before applying it to the second summing node;

(b) n-level quantizing means, having an input coupled to said second summing node, for quantizing the analog into a digital signal by oversampling and providing a digital signal having a plurality of levels (n) at an output therefrom;

(c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and (d) direct current (DC) feedback means, having an input coupled to the output of said D/A converting means and an output coupled to a negative input of said second summing node, for feeding back a DC voltage to minimize DC offset voltages within the apparatus;

further including a dither generator coupled to the second summing node and having a low-noise output at the non-zero carrier frequency due to an included bandreject filter centered thereat, said dither generator utilized to randomize quantization errors and to smooth an associated frequency spectrum of the error.

16. An apparatus for converting a signal having a non-zero frequency carrier or suppressed carrier with modulation thereon from an analog signal to a digital signal with improved signal-to-noise ratio performance, the apparatus comprising:

(a) bandpass filtering means, having an input coupled to a first summing node, an output coupled to a positive input of a second summing node, and having an associated damped sinusoidal impulse response therein, for filtering the analog signal before applying it to the second summing node;

(b) n-level quantizing means, having an input coupled to said second summing node, for quantizing the analog signal into a digital signal by oversampling and providing a digital signal having a plurality of levels (n) at an output therefrom;

(c) n-level D/A converting means, having an input coupled to the output from said quantizing means and having an output coupled to said first summing node, for converting said n-level digital signal back to an analog signal to provide a negative feedback signal to the first summing node for providing improved signal-to-noise ratio performance; and (d) direct current (DC) feedback means, having an input coupled to the output of said D/A converting means and an output coupled to a negative input of said second summing node, for feeding back a DC voltage to minimize DC offset voltages within the apparatus;

wherein the improved signal-to-noise ratio performance allows a dynamic range of approximately 95–98 dB to be achieved.

17. An apparatus for converting a signal having a non-zero frequency carrier or suppressed with modulation thereon from an analog signal to a digital signal with improved signal-to-noise ratio performance, the apparatus comprising:

(a) bandpass filtering means, having an input coupled to a first summing node, an output coupled to a positive input of a second summing node, and having an associated damped sinusoidal impulse response therein, for filtering the analog signal before applying it to the second summing node;

(b) n-level quantizing means, having an input coupled to said second summing node, for quantizing the analog signal into a digital signal by oversampling and providing a digital signal having a plurality of levels (n) at an output therefrom;

(c) n-level D/A converting means, having an input coupled to the output of said D/A converting means and an output coupled to a negative input of said second summing node, for feeding back a DC voltage to minimize DC offset voltages within the apparatus;

wherein any of said bandpass filtering means, said n-level quantizing means, said n-level D/A converting means, and said DC feedback means are constructed and arranged in dual differential form to provide further noise immunity and substantially reduced power requirements.

18. A method for converting a signal having a non-zero frequency carrier with modulation thereon from an analog signal to a digital signal with improved signal-to-noise ratio performance, the method comprising the steps of:

(a) bandpass filtering the analog signal supplied from a first summing node to provide a filtered signal to a second summing node;

(b) quantizing the filtered analog signal by oversampling and providing a digital signal having a plurality of levels (n) at an output therefrom;

(c) converting the n-level digital signal back to an analog signal to provide a negative feedback to signal to the first summing node for providing improved signal-to-noise ratio performance; and (d) feeding back a DC voltage developed in step (c) to a negative input of said second summing node, to minimize DC offset voltages developed within the apparatus, said method providing improved signal-to-noise ratio performance which allows a dynamic range of approximately 95–98 dB to be achieved.

19. A method for converting a signal having a non-zero frequency carrier with modulation thereon from an analog signal to a digital signal with improved signal-to-noise ratio performance, the method comprising the steps of:

(a) bandpass filtering and amplifying the analog signal supplied from a first summing node to provide a filtered signal to a second summing node;

(b) quantizing the filtered analog signal by oversampling and providing a digital signal having a plurality of levels (n) at an output therefrom;

(c) converting the n-level digital signal back to an analog signal to provide a negative feedback signal to the first summing node for providing improved signal-to-noise ratio performance; and (d) feeding back a DC voltage developed in step (c) to a negative input of said second summing node, to minimize DC offset voltages developed within the apparatus, said method providing improved signal-to-noise ratio performance which allows a dynamic range of approximately 95–98 dB to be achieved.

20. A method for converting a signal having a non-zero frequency carrier with modulation thereon from an analog signal to a digital signal with improved signal-to-noise ratio performance, the method comprising the steps of:

bandpass filtering the analog signal supplied from a first summing node, and dithering the filtered analog signal by applying a dithered signal, having a bandreject characteristic centered at the non-zero carrier frequency to provide a filtered signal to a second summing node;

(b) quantizing the filtered analog signal by oversampling and providing a digital signal having a plurality of levels (n) at an output therefrom;

(c) converting the n-level digital signal back to an analog signal to provide a negative feedback signal to the first summing node for providing improved signal-to-noise ratio performance; and (d) feeding back a DC voltage developed in step (c) to a negative input of said second summing node, to minimize DC offset voltages developed within the apparatus, said method providing improved signal-to-noise ratio performance which allows a dynamic range of approximately 95–98 dB to be achieved.

21. A method for converting a signal having a non-zero frequency carrier with modulation thereon from an analog signal to a digital signal with improved signal-to-noise ratio performance, the method comprising the steps of:

(a) bandpass filtering the analog signal supplied from a first summing node to provide a filtered signal to a second summing node;

(b) quantizing the filtered analog signal by oversampling and providing a digital signal having a plurality of levels (n) at an output therefrom, and wherein n=2;

(c) converting the n-level digital signal back to an analog signal to provide a negative feedback signal to the first summing node for providing improved signal-to-noise ratio performance; and (d) feeding back a DC voltage developed in step (c) to a negative input of said second summing node, to minimize DC offset voltages developed within the apparatus, said method providing improved signal-to-noise ratio performance which allows a dynamic range of approximately 95–98 dB to be achieved.

22. The method according to claim 21, further including the step of reducing DC offset voltages present when converting to and from two levels (n=2) for the digital signal.

23. A radio for receiving modulation information carried by an RF signal and deriving a non-zero frequency IF signal therefrom that is converted from an analog signal to a digital signal for subsequent digital processing, said radio comprising:

front end means, including at least a mixer and a local oscillator, for providing an analog IF signal having a non-zero carrier frequency;

means for processing a digital signal to extract the modulation information contained therein; and a bandpass sigma delta converter, coupled therebetween, comprising:

(a) bandpass filtering means, including an input coupled from a first summing node and an output coupled to a positive input of a second summing node, for filtering the analog signal;

(b) n-level quantizing means, including an input coupled from said second summing node, for quantizing the analog signal by oversampling and providing an n-level digital signal to an output thereof;

(c) n-level D/A converting means, including an input coupled to the output from said quantizing means, for converting said n-level digital signal back to an analog signal to provide a negative feedback signal to the first summing node for providing improved signal-to-noise ratio performance; and (d) DC feeding means, including an input coupled to the output of said D/A converting means, for feeding back a DC voltage to a negative input of said second summing node to minimize DC offset voltages within the bandpass sigma delta converter.

24. The radio according to claim 23, wherein said front end means comprises a mixer, local oscillator and a preselector filter.

25. The radio according to claim 23, wherein said digital processing means comprises a digital signal processor.

26. The radio according to claim 23, wherein any of said bandpass filtering means, said n-level quantizing means, and n-level D/A converting means, and said DC feedback means are constructed and arranged in dual differential form to provide further noise immunity.

27. In a radio, a method for processing an analog received signal, said method including the steps of:

(a) bandpass filtering and amplifying said analog received signal to form a filtered signal;

(b) dithering said filtered signal and oversampling said filtering signal to provide a digital version having a plurality (n) of levels;

(c) providing a digital output signal, said digital output being based at least in part on said digital version of said filtered signal;

(d) providing an analog version of said digital output signal;

(e) providing a first negative feedback signal, said first negative feedback signal being based at least in part on said analog version of said digital output signal;

(f) combining said first negative feedback signal with said analog received signal to achieve negative feedback;

(g) providing a second negative feedback signal, said second negative feedback signal being based at least in part on the direct current offset voltage of said analog version of said digital output signal;

(h) combining said second negative feedback signal with said filtered signal to achieve negative feedback.

28. The method of claim 27, wherein said providing step (b) includes the step of: quantizing said filtering analog signal by oversampling and providing a digital signal having a plurality (n) of levels.

29. The method of claim 28, wherein said providing step (b) n=2.

30. A radio having means for processing an analog received signal, said means comprising:

bandpass filtering means for bandpass filtering said analog received signal to form a filtered signal;

first converting means for providing a digital version of filtered signal;

output means for providing a digital output signal, said digital output signal being based at least in part on said digital version of said filtered signal;

second converting means for providing an analog version of said digital output signal;

first feedback means for providing a first negative feedback signal, said first negative feedback signal being based at least in part on said analog version of said digital output signal;

first combining means for combining said first negative feedback signal with said analog received signal to achieve negative feedback;

second feedback means for providing a second negative feedback signal, said second negative feedback signal being based at least in part on the direct current offset voltage of said analog version of said digital output signal;

second combining means for combining said second negative feedback signal with said filtered signal to achieve negative feedback;

said radio further including amplifying means responsive to said filtering signal for amplifying said filtered signal.

31. The radio of claim 30 further including dithering means responsive to said filtered signal for dithering said filtering signal.

32. The radio of claim 31, wherein said first converting means includes quantizing means for quantizing said filtering signal by oversampling and providing a digital signal having a plurality (n) of levels.

33. The radio of claim 32, wherein said first converting means n=2.

* * * * *

UNITED STATES PATENT AND TRADEMARK OFFICE
CERTIFICATE OF CORRECTION

PATENT NO. : 4,857,928

DATED : August 15, 1989

INVENTOR(S) : Paul Gailus et al.

It is certified that error appears in the above-identified patent and that said Letters Patent is hereby corrected as shown below:

Col. 7, line 35, "perforrmance" should be --performance--.
Col. 8, line 16, between the words "output" and "to" please insert the word --coupled--.
Col. 8, line 57, between the words "second" and "pole" please insert the word --single--.
Col. 11, line 3, between the words "analog" and "into" please insert the word --signal--.
Col. 14, line 14, delete the word "and" and insert thereat --said--.
Col. 14, line 22, "filtering" should be --filtered--.
Col. 14, line 25, before the word "being" insert the word --signal--.
Col. 14, line 54, between the words "of" and "filtered" please insert the word --said--.
Col. 15, line 8, "filtering" should be --filtered--.
Col. 16, line 3, "filtering" should be --filtered--.
Col. 16, line 6, "filtering" should be --filtered--.

Signed and Sealed this

Seventeenth Day of July, 1990

*Attest:*

HARRY F. MANBECK, JR.

*Attesting Officer*     *Commissioner of Patents and Trademarks*